(12) United States Patent
Balasekaran

(10) Patent No.: US 12,176,365 B2
(45) Date of Patent: Dec. 24, 2024

(54) LIGHT DETECTION DEVICE

(71) Applicant: Sumitomo Electric Industries, Ltd., Osaka (JP)

(72) Inventor: Sundararajan Balasekaran, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 400 days.

(21) Appl. No.: 17/838,888

(22) Filed: Jun. 13, 2022

(65) Prior Publication Data

US 2023/0031456 A1 Feb. 2, 2023

(30) Foreign Application Priority Data

Aug. 2, 2021 (JP) ................. 2021-126768

(51) Int. Cl.
*H01L 27/14* (2006.01)
*H01L 27/146* (2006.01)
*H01L 31/105* (2006.01)

(52) U.S. Cl.
CPC .... *H01L 27/1462* (2013.01); *H01L 27/14649* (2013.01); *H01L 31/105* (2013.01)

(58) Field of Classification Search
CPC .......... H01L 27/14603; H01L 27/1462; H01L 27/14634; H01L 27/1464; H01L 27/14649; H01L 27/1465; H01L 31/105
See application file for complete search history.

(56) References Cited

U.S. PATENT DOCUMENTS

2018/0342635 A1* 11/2018 Balasekaran ... H01L 31/022408
2021/0066521 A1 3/2021 Iguchi

FOREIGN PATENT DOCUMENTS

JP 2021-034644 A 3/2021

* cited by examiner

*Primary Examiner* — Kevin K Pyo
(74) *Attorney, Agent, or Firm* — Volpe Koenig

(57) ABSTRACT

A light detection device includes a sensor array and a readout circuit. The sensor array includes a compound semiconductor substrate having a first main surface and a second main surface opposite to the first main surface, a plurality of photodetectors arranged two-dimensionally on the first main surface, and an insulating film disposed on the second main surface. The readout circuit includes a silicon substrate having a third main surface connected to the first main surface of the compound semiconductor substrate. The insulating film contains an insulating material having a lower thermal expansion coefficient than a compound semiconductor contained in the compound semiconductor substrate. The insulating film includes at least one first portion having a first thickness and a second portion having a second thickness larger than the first thickness.

6 Claims, 3 Drawing Sheets

LIGHT DETECTION DEVICE

CROSS REFERENCE TO RELATED APPLICATIONS

This application claims priority based on Japanese Patent Application No. 2021-126768 filed on Aug. 2, 2021, and the entire contents of the Japanese patent application are incorporated herein by reference.

TECHNICAL FIELD

The present disclosure relates to a light detection device.

BACKGROUND

Japanese Unexamined Patent Application Publication No. 2021-34644 discloses a light detection device in which a two dimensional array type photodetector and a readout circuit are joined by an In bump.

SUMMARY

A light detection device according to one aspect of the present disclosure includes a sensor array and a readout circuit. The sensor array includes a compound semiconductor substrate having a first main surface and a second main surface opposite to the first main surface, a plurality of photodetectors arranged two-dimensionally on the first main surface, and an insulating film disposed on the second main surface. The readout circuit includes a silicon substrate having a third main surface connected to the first main surface of the compound semiconductor substrate. The insulating film contains an insulating material having a lower thermal expansion coefficient than a compound semiconductor contained in the compound semiconductor substrate. The insulating film includes at least one first portion having a first thickness and a second portion having a second thickness larger than the first thickness.

DETAILED DESCRIPTION

Figure 1:
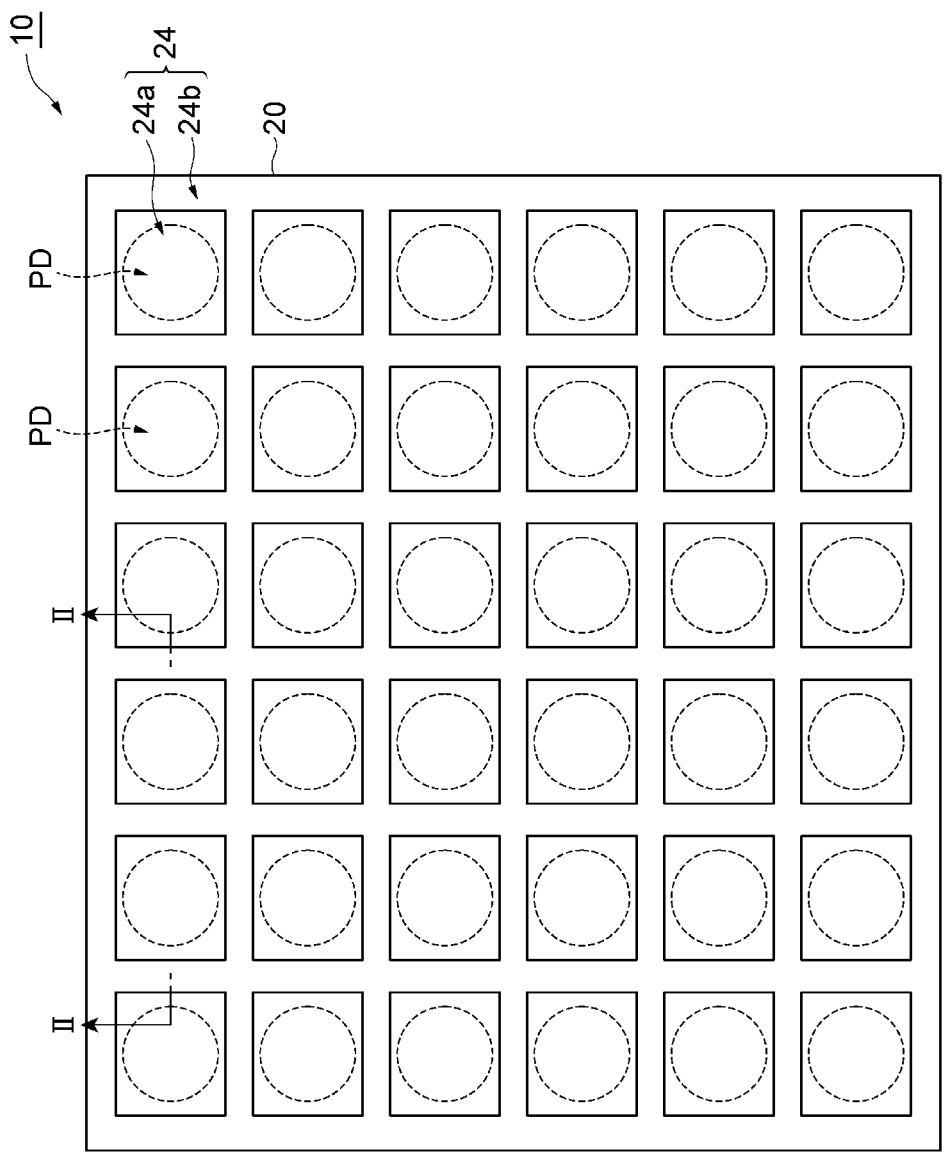
FIG. 1 is a plan view schematically illustrating a light detection device according to one embodiment.

The two dimensional array type photodetector includes a compound semiconductor substrate. The readout circuit includes a silicon substrate. Due to a difference between a thermal expansion coefficient of the compound semiconductor and a thermal expansion coefficient of silicon, the compound semiconductor substrate and the silicon substrate may warp due to a temperature change. The thermal expansion coefficient of the compound semiconductor is larger than thermal expansion coefficient of silicon. As a result, for example, when the light detection device is cooled, an amount of contraction of the compound semiconductor substrate becomes larger than an amount of contraction of the silicon substrate. As a result, warpage of the compound semiconductor substrate and the silicon substrate occurs. When the amount of warpage increases, there is a possibility that the compound semiconductor substrate or the silicon substrate may crack.

The present disclosure provides a light detection device capable of suppressing warpage due to temperature change.

DESCRIPTION OF EMBODIMENTS OF PRESENT DISCLOSURE

A light detection device according to one embodiment includes a sensor array and a readout circuit. The sensor array includes a compound semiconductor substrate having a first main surface and a second main surface opposite to the first main surface, a plurality of photodetectors arranged two-dimensionally on the first main surface, and an insulating film disposed on the second main surface. The readout circuit includes a silicon substrate having a third main surface connected to the first main surface of the compound semiconductor substrate. The insulating film contains an insulating material having a lower thermal expansion coefficient than a compound semiconductor contained in the compound semiconductor substrate. The insulating film includes at least one first portion having a first thickness and a second portion having a second thickness larger than the first thickness.

According to the light detection device, warpage of the compound semiconductor substrate and the silicon substrate due to temperature change can be suppressed by the insulating film. Further, the warpage of the compound semiconductor substrate and the silicon substrate can be further suppressed by increasing the second thickness of the second portion of the insulating film.

The second thickness may be 2 μm or more. In this case, the warpage of the compound semiconductor substrate and the silicon substrate can be further suppressed.

The second thickness may be 5 μm or less. In this case, it is easy to control the second thickness when forming the insulating film.

The at least one first portion may include a plurality of first portions arranged two-dimensionally on the second main surface. Each of the plurality of photodetectors may at least partially overlap a corresponding one of the plurality of first portions as viewed in a direction orthogonal to the first main surface. In this case, each photodetector can detect light transmitted through each first portion.

Each of the plurality of photodetectors may include a light-absorbing layer containing a III-V compound semiconductor. The III-V compound semiconductor may be a ternary compound or a quaternary compound. In this case, the composition of the III-V compound semiconductor can be changed.

Each of the plurality of photodetectors may include a light-absorbing layer having a type-II superlattice structure. In this case, each photodetector can detect infrared light having a long wavelength.

DETAILS OF EMBODIMENTS OF PRESENT DISCLOSURE

Embodiments of the present disclosure will now be described in detail with reference to the accompanying drawings. In the description of the drawings, the same reference numerals are used for the same or equivalent elements, and redundant description is omitted. In the drawings, an X-axis direction, a Y-axis direction, and a Z-axis direction that intersect each other are illustrated. The X-axis direction, the Y-axis direction, and the Z-axis direction are orthogonal to each other, for example.

Figure 2:
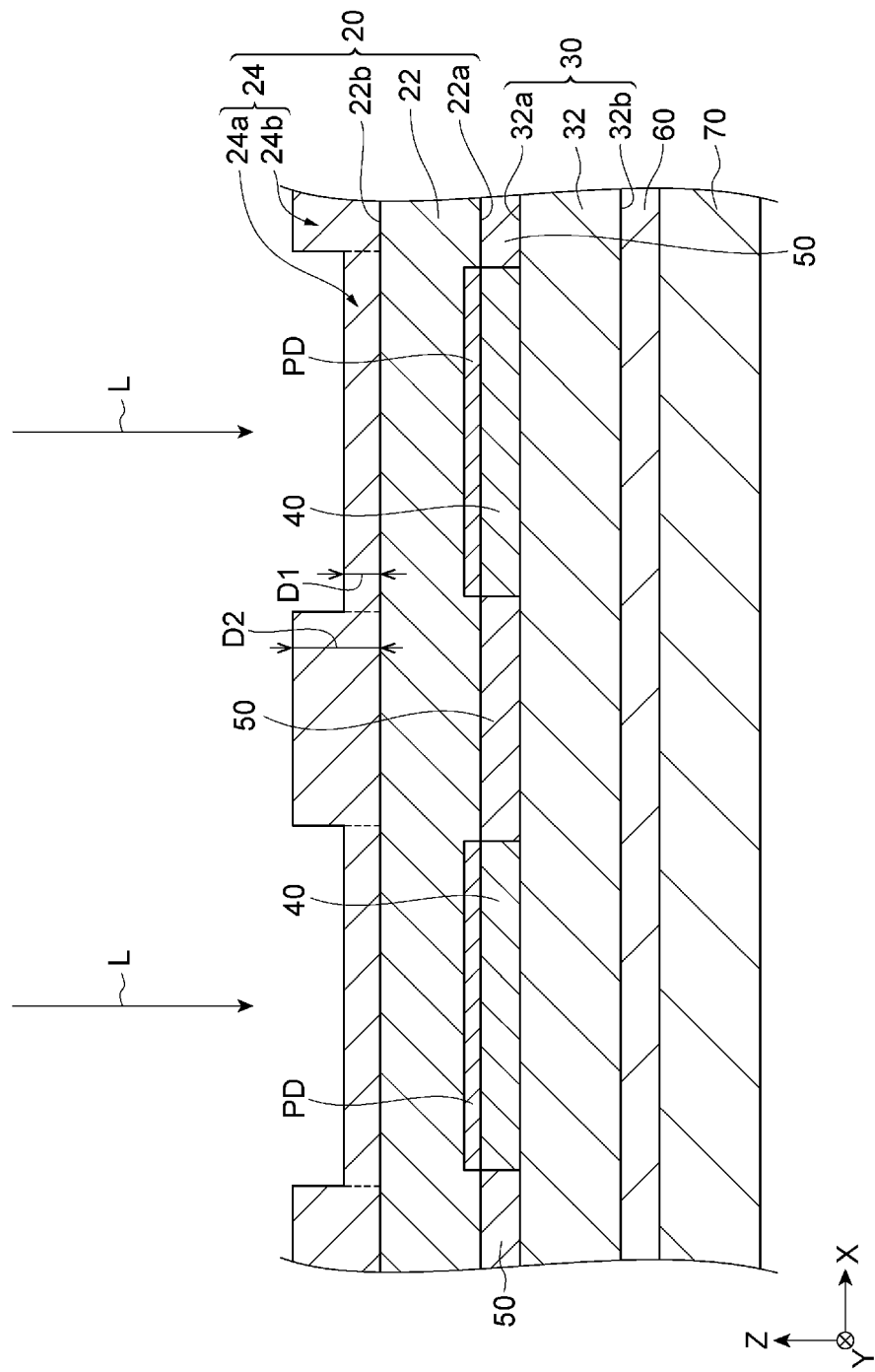
FIG. 2 is a cross-sectional view taken along line II-II of FIG. 1.

FIG. 1 is a plan view schematically illustrating a light detection device according to one embodiment. FIG. 2 is a cross-sectional view taken along line II-II of FIG. 1. A light detection device 10 illustrated in FIG. 1 and FIG. 2 includes a sensor array 20 and a read-out integrated circuit (ROIC) 30. Light detection device 10 may be an image sensor capable of detecting a light L. Light L may be, for example, infrared light having a wavelength of 2 μm to 6 μm. Sensor array 20 includes a compound semiconductor substrate 22, a plurality of photodetectors PD, and an insulating film 24.

Compound semiconductor substrate 22 has a first main surface 22a and a second main surface 22b opposite to first main surface 22a. Second main surface 22b is an incident surface on which light L is incident. First main surface 22a and second main surface 22b may each have a rectangular shape. First main surface 22a and second main surface 22b may each have an area greater than 1 cm². First main surface 22a and second main surface 22b may each have an area equal to 2 cm² or more. Compound semiconductor substrate 22 includes, for example, a compound semiconductor such as III-V compound semiconductor. A thermal expansion coefficient of the compound semiconductor contained in compound semiconductor substrate 22 is larger than a thermal expansion coefficient of silicon. Examples of III-V compound semiconductor include gallium antimony (GaSb). The thermal expansion coefficient of GaSb is $5.53 \times 10^{-6}$ [/K]. The thermal expansion coefficient of silicon is $2.50 \times 10^{-6}$ [/K]. A Young's modulus of the compound semiconductor contained in compound semiconductor substrate 22 is smaller than a Young's modulus of silicon. A Young's modulus of GaSb is 63.1 GPa. The Young's modulus of silicon is 163 GPa. A thickness of compound semiconductor substrate 22 may be from 100 μm to 500 μm.

Plurality of photodetectors PD are two dimensionally arranged on first main surface 22a. Each of plurality of photodetectors PD may be a photodiode.

Insulating film 24 is provided on second main surface 22b of compound semiconductor substrate 22. Insulating film 24 may be provided over entire second main surface 22b. Insulating film 24 may be formed by plasma chemical vapor deposition (CVD). Insulating film 24 may have a transmittance of 90% or more with respect to light L. Insulating film 24 includes an insulating material. The insulating material contained in insulating film 24 has a thermal expansion coefficient smaller than the thermal expansion coefficient of the compound semiconductor contained in compound semiconductor substrate 22. The insulating material included in insulating film 24 may have a thermal expansion coefficient of more than $2.5 \times 10^{-6}$ [/K] and $5 \times 10^{-6}$ [/K] or less. Examples of the insulating material included in insulating film 24 may include silicon nitride ($SiN_x$), silicon dioxide ($SiO_2$), and silicon oxynitride ($SiO_xN_y$). The thermal expansion coefficient of $SiN_x$ is $2.9 \times 10^{-6}$ [/K]. A Young's modulus of the insulating material included in insulating film 24 may be larger than the Young's modulus of the compound semiconductor included in compound semiconductor substrate 22. A Young's modulus of $SiN_x$ is from 97 GPa to 168 GPa. A Young's modulus of $SiO_xN_y$ is from 67 GPa to 94 GPa. The Young's modulus of $SiN_x$ or the Young's modulus of $SiO_xN_y$ can be adjusted by the flow rate of silane gas when forming insulating film 24.

Insulating film 24 has at least one first portion 24a having a first thickness D1 and a second portion 24b having a second thickness D2 greater than first thickness D1. At least one first portion 24a may be a plurality of first portions 24a arranged in a two dimensional manner in second main surface 22b. Plurality of first portions 24a may be arrayed in the X-axis direction and the Y-axis direction at a pitch of, for example, from 10 μm to 30 μm. First thickness D1 may be $n \times \lambda/4$, where $\lambda$ is a wave length of light L and n is a natural number. In this case, each of plurality of first portions 24a functions as an antireflection film. First thickness D1 may be from 200 nm to 300 nm. First portion 24a may include at least one of silicon nitride ($SiN_x$), silicon dioxide ($SiO_2$), and silicon oxynitride ($SiO_xN_y$). Each of plurality of first portions 24a may be formed by photolithography and etching.

Second portion 24b may be a partition portion disposed between adjacent first portions 24a. A length of second portion 24b (distance between adjacent first portions 24a) in the X-axis direction or the Y-axis direction may be from 0.5 μm to 5 μm. Second portion 24b may be lattice-shaped, for example. Second thickness D2 may be greater than or equal to five times first thickness D1. Second thickness D2 may be 0.4 μm or more. Second thickness D2 may be 2 μm or more. Second thickness D2 may be 5 μm or less. Second portion 24b may include an insulating material that is different from the insulating material included in first portion 24a. Second portion 24b may include silicon nitride ($SiN_x$).

When viewed from the direction (Z-axis direction) orthogonal to first main surface 22a, each of plurality of photodetectors PD and each of plurality of first portions 24a may at least partially overlap each other. When viewed from the Z-axis direction, the entirety of each of plurality of photodetectors PD may be covered by each of plurality of first portions 24a. In this case, second portion 24b does not overlap each of plurality of photodetectors PD when viewed from the Z-axis direction.

Readout circuit 30 receives electrical signals from sensor array 20. Readout circuit 30 may include a multiplexer based on Complementary Metal Oxide Semiconductor (CMOS). Readout circuit 30 includes a silicon substrate 32. Silicon substrate 32 has a third main surface 32a connected to first main surface 22a of compound semiconductor substrate 22 and a fourth main surface 32b opposite to third main surface 32a. Third main surface 32a includes circuitry. Third main surface 32a and fourth main surface 32b may each have a rectangular shape. Third main surface 32a and fourth main surface 32b may each have an area greater than 1 cm². Third main surface 32a and fourth main surface 32b may each have an area equal to 2 cm² or more. A thickness of silicon substrate 32 may be greater than the thickness of compound semiconductor substrate 22. The thickness of silicon substrate 32 may be from 200 μm to 600 μm.

Light detection device 10 may include at least one conductor portion 40 disposed between third main surface 32a of silicon substrate 32 and first main surface 22a of compound semiconductor substrate 22. At least one conductor portion 40 may be a plurality of conductor portions 40 arranged two dimensionally in first main surface 22a or third main surface 32a. Third main surface 32a of silicon substrate 32 and first main surface 22a of compound semiconductor substrate 22 are connected to each other by each of conductor portions 40. Each of conductor portions 40 may be a bump including a metal such as indium. Each of conductor portions 40 electrically connects a second electrode E2 (see FIG. 3) of each of plurality of photodetectors PD to an electrode provided on third main surface 32a of silicon substrate 32. A thickness of each of conductor portions 40 may be from 1 μm to 10 μm. A resin portion 50 may be disposed between adjacent conductor portions 40. When viewed from the Z-axis direction, each of conductor portions 40 at least partially overlaps each of first portions 24a. When viewed from the Z-axis direction, resin portion 50 at least partially overlaps second portion 24b.

Light detection device 10 may include a metal layer 60 and a ceramic substrate 70. Metal layer 60 is provided on fourth main surface 32b of silicon substrate 32. Metal layer 60 is disposed between fourth main surface 32b and ceramic substrate 70. Fourth main surface 32b of silicon substrate 32 and ceramic substrate 70 are connected to each other by metal layer 60. Metal layer 60 may include a cured product of silver paste. A thickness of metal layer 60 may be from 10 μm to 30 μm. Ceramic substrate 70 may include aluminum nitride. A thickness of ceramic substrate 70 may be from 400 μm to 600 μm.

Figure 3:
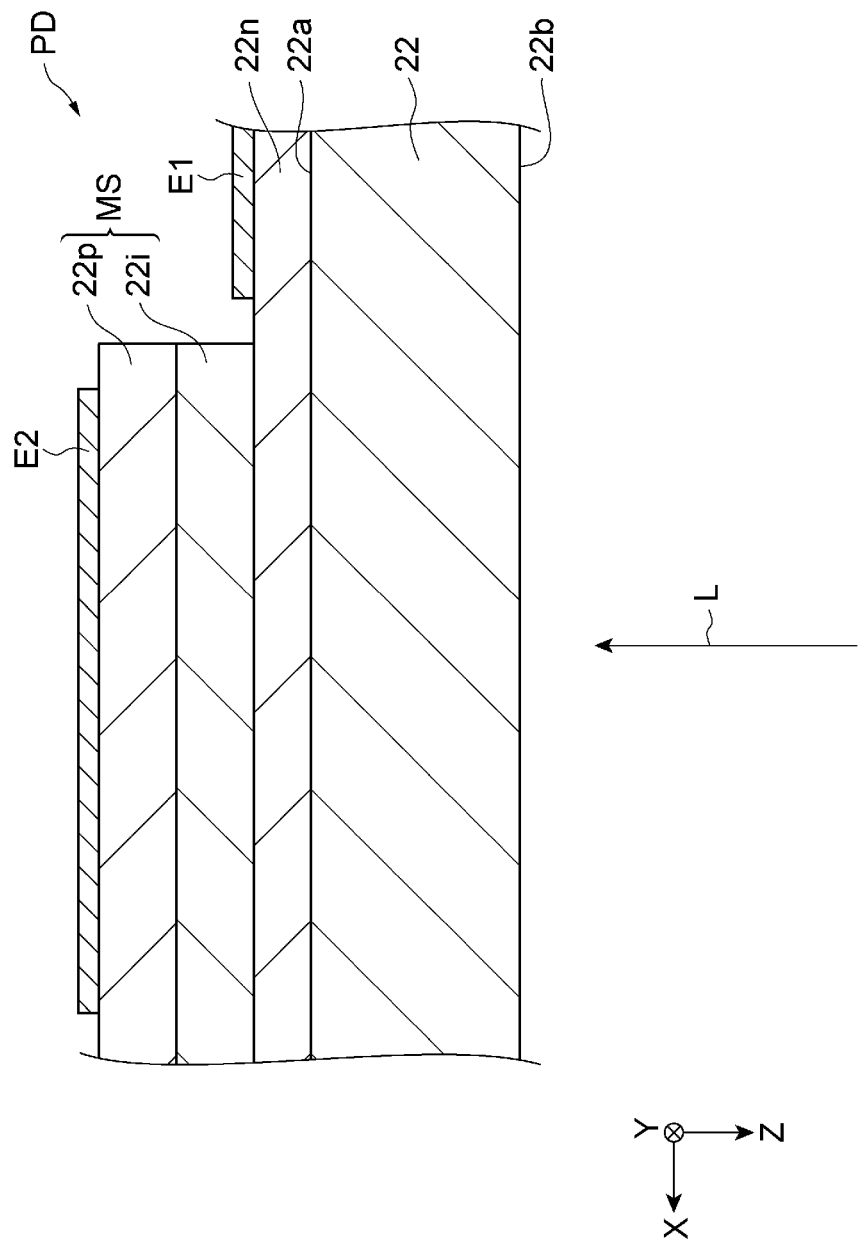
FIG. 3 is an enlarged view of a portion of FIG. 2.

FIG. 3 is an enlarged view of a part of FIG. 2. As shown in FIG. 3, each of plurality of photodetectors PD may include an n-type semiconductor layer 22n provided on first main surface 22a of compound semiconductor substrate 22, a light-absorbing layer 22i provided on n-type semiconductor layer 22n, and a p-type semiconductor layer 22p provided on light-absorbing layer 22i. A first electrode E1 is connected to n-type semiconductor layer 22n. Second electrode E2 is connected to p-type semiconductor layer 22p. Light-absorbing layer 22i and p-type semiconductor layer 22p are included in a mesa MS provided on n-type semiconductor layer 22n. First electrode E1 is distant from mesa MS.

Each of n-type semiconductor layer 22n and p-type semiconductor layer 22p includes a III-V compound semiconductor. A first barrier layer may be disposed between n-type semiconductor layer 22n and light-absorbing layer 22i. A second barrier layer may be disposed between p-type semiconductor layer 22p and light-absorbing layer 22i. Each of the first barrier layer and the second barrier layer includes a III-V compound semiconductor.

Light-absorbing layer 22i is sensitive to light L. Light-absorbing layer 22i includes a III-V compound semiconductor. The III-V compound semiconductor may be a ternary compound or a quaternary compound. In this case, the composition of the III-V compound semiconductor can be changed. An example of the ternary compound includes InGaAs. An example of the quaternary compound includes InGaAsP. Light-absorbing layer 22i may have a type-II superlattice structure. In this case, infrared rays of long wavelengths can be detected by each of plurality of photodetectors PD. The type-II superlattice structure may include a plurality of InGaAs layers and a plurality of GaAsSb layers. The InGaAs layer and the GaAsSb layer are alternately stacked.

According to light detection device 10, warpage of compound semiconductor substrate 22 and silicon substrate 32 due to a temperature change can be suppressed by insulating film 24. For example, when light detection device 10 is cooled from 300K to 77K, since an amount of contraction of insulating film 24 is small, the contraction of compound semiconductor substrate 22 is suppressed. As a result, an amount of warpage of compound semiconductor substrate 22 and an amount of warpage of silicon substrate 32 are reduced. Therefore, even if the temperature change is applied to light detection device 10, compound semiconductor substrate 22 and silicon substrate 32 are less likely to be cracked.

When second thickness D2 of second portion 24b is, for example, 2 μm or more, warpage of compound semiconductor substrate 22 and silicon substrate 32 can be further suppressed.

When Second thickness D2 of second portion 24b is 5 μm or less, second thickness D2 may be easily controlled when forming insulating film 24.

When each of plurality of photodetectors PD and each of plurality of first portions 24a at least partially overlap each other as viewed from the Z-axis direction, each of plurality of photodetectors PD can detect light L transmitted through each of first portions 24a. By making first portion 24a thin, first portion 24a can function as an antireflection film. On the other hand, by making second portion 24b thick, it is possible to increase the effect of suppressing the expansion and contraction of compound semiconductor substrate 22.

Although preferred embodiments of the present disclosure have been described in detail above, the present disclosure is not limited to the above embodiments. The constituent elements of the embodiments may be arbitrarily combined.

The embodiments disclosed herein are to be considered in all respects as illustrative and not restrictive. The scope of the present invention is defined not by the above-described meaning but by the scope of claims, and is intended to include meanings equivalent to the scope of claims and all modifications within the scope.

What is claimed is:

1. A light detection device comprising:
   a sensor array including a compound semiconductor substrate having a first main surface and a second main surface opposite to the first main surface, a plurality of photodetectors arranged two-dimensionally on the first main surface, and an insulating film disposed on the second main surface; and
   a readout circuit including a silicon substrate having a third main surface connected to the first main surface of the compound semiconductor substrate,
   wherein the insulating film contains an insulating material having a lower thermal expansion coefficient than a compound semiconductor contained in the compound semiconductor substrate, and
   the insulating film includes at least one first portion having a first thickness and a second portion having a second thickness larger than the first thickness.

2. The light detection device according to claim 1, wherein the second thickness is 2 μm or more.

3. The light detection device according to claim 1, wherein the second thickness is 5 μm or less.

4. The light detection device according to claim 1, wherein
   the at least one first portion comprises a plurality of first portions arranged two-dimensionally on the second main surface, and
   each of the plurality of photodetectors at least partially overlaps a corresponding one of the plurality of first portions as viewed in a direction orthogonal to the first main surface.

5. The light detection device according to claim 1, wherein each of the plurality of photodetectors includes a light-absorbing layer containing a III-V compound semiconductor, the III-V compound semiconductor being a ternary compound or a quaternary compound.

6. The light detection device according to claim 1, wherein each of the plurality of photodetectors includes a light-absorbing layer having a type-II superlattice structure.

* * * * *